United States Patent [19]

Yamamoto

[11] Patent Number: 4,899,257
[45] Date of Patent: Feb. 6, 1990

[54] ELECTRIC DEVICE WITH AN OPERATION INDICATING LAMP

[75] Inventor: Masato Yamamoto, Imari, Japan

[73] Assignee: Omron Tateisi Electronics Co., Kyoto, Japan

[21] Appl. No.: 333,865

[22] Filed: Apr. 4, 1989

Related U.S. Application Data

[63] Continuation of Ser. No. 25,744, Mar. 13, 1987, abandoned.

[30] Foreign Application Priority Data

Mar. 14, 1986 [JP] Japan .............................. 61-37798[U]

[51] Int. Cl.⁴ ............................................... H05K 1/14
[52] U.S. Cl. ...................................... 361/395; 29/841; 29/855; 174/52.2; 361/392; 361/394
[58] Field of Search ............... 29/841, 855; 174/52 R, 174/52.1, 52 PE, 522; 307/311; 328/119; 340/641; 357/72; 361/31, 104, 386–389, 392, 394–395, 399

[56] References Cited

U.S. PATENT DOCUMENTS

| | | | |
|---|---|---|---|
| 4,038,584 | 7/1977 | Tarchalski et al. | 361/104 |
| 4,054,932 | 10/1977 | Sehmer et al. | 361/31 |
| 4,172,272 | 10/1979 | Schneider | 361/386 |
| 4,361,371 | 11/1982 | Williams | 361/399 |
| 4,620,263 | 10/1986 | Ito | 361/395 |

FOREIGN PATENT DOCUMENTS 2031395 12/1971 Fed. Rep. of Germany ...... 361/395

*Primary Examiner*—Gregory D. Thompson
*Attorney, Agent, or Firm*—Foley & Lardner, Schwartz, Jeffery, Schwaab, Mack, Blumenthal & Evans

[57] ABSTRACT

An electric device with an operation indicating light has a base and a case transversely divisible in a main frame and a case cover. The main frame is fitted to the base at one open end of the frame. A resin material is injected into the space provided by the base and the main frame. The case cover is fitted to the other open end of the main frame so that an operating indicating lamp can be seen through an indicating hole in the case cover. Thus, the device can be easily assembled, and the resin material does not leak from the gap between the operation indicating lamp and the indicating hole. Cracks are prevented from developing in the solder connecting the lamp to the circuit board. In addition, the lamp can be positioned at a high precision because no packing is required to prevent resin leakage.

8 Claims, 3 Drawing Sheets

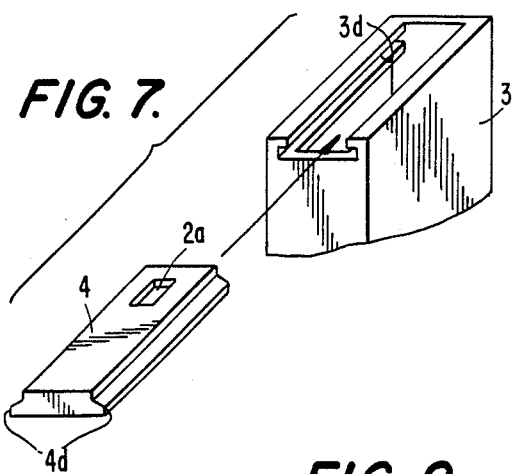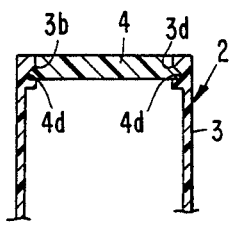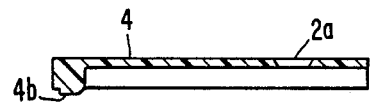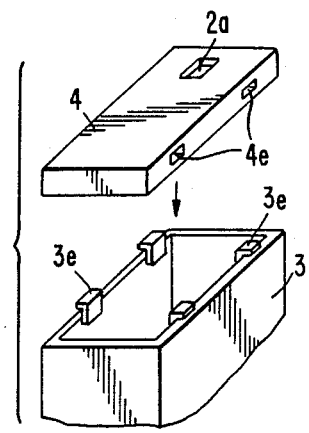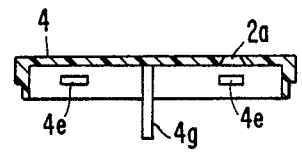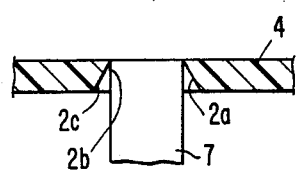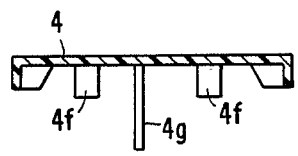

ELECTRIC DEVICE WITH AN OPERATION INDICATING LAMP

This application is a continuation of application Ser. No. 07/025,722, filed Mar. 13, 1987 now abandoned.

BACKGROUND OF THE INVENTION

1. Field of the Invention

This invention relates to an electric device with an operation indicating lamp which may be used with a solid state relay and, more particularly to an improved device which can be easily assembled.

2. Related Art

An electric device which is used for a solid state relay and has a light emitting diode (LED) as an operation indicating lamp is well known. In the conventional device, the LED is electrically connected to a circuit board and can be seen through an indicating hole disposed in the front cover of a case. A packing is interposed between the base of the LED and the front cover. The case is filled with a resin material which is injected through an opening in the case. The resin is set to fix the position of the circuit board and the electric components mounted on the board.

SUMMARY OF THE INVENTION

It is, therefore, an object of this invention to provide an electric device with an operation indicating lamp which prevents resin leakage.

It is another object of this invention to provide an electric device with an operation indicating lamp which prevents cracks from developing in the solder electrically connecting the terminals of the LED to the circuit board.

It is a still another object of this invention to provide an electric device with an operation indicating lamp which is easily assembled.

It is a further object of this invention to provide an electric device with an operation indicating lamp which requires no packing to prevent resin leakage.

It is still further object of this invention to provide an electric device with an operation indicating lamp which is precisely positioned.

According to this invention, there is provided an electric device with an operation indicating lamp comprising a base and a case transversely divisible into a main frame and a case cover, the main frame being fitted to the base. The case cover has an indicating hole through which an operation indicating lamp is visible. A resin material, for fixing the components in the case, is injected into the space provided by the base and the main frame.

BRIEF DESCRIPTION OF THE DRAWINGS

FIG. 7 is a disassembled perspective view of a case employed in an electric device with an operation indicating lamp in a third embodiment of the invention;

FIG. 8 is a side partial-sectional view of the assembled case of FIG. 7;

FIG. 9 is a sectional view of the case cover of FIG. 8;

FIG. 10 is a disassembled perspective view of a case employed in an electric device with an operation indicating lamp in a fourth embodiment of the invention;

FIG. 11 is a sectional view of the case cover of FIG. 10;

FIG. 12 is an enlarged sectional view of the case cover of FIG. 11;

FIG. 14 is a sectional view of the case cover of FIG. 13.

DETAILED DESCRIPTION OF THE EMBODIMENTS

Figure 1:
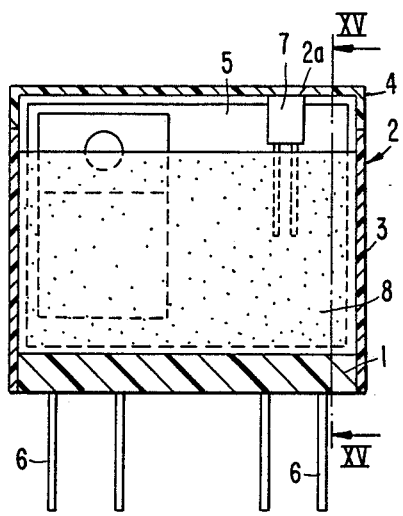
FIG. 1 is a front sectional view of an electric device with an operation indicating lamp and illustrating a first embodiment of the invention.
Figure 2:
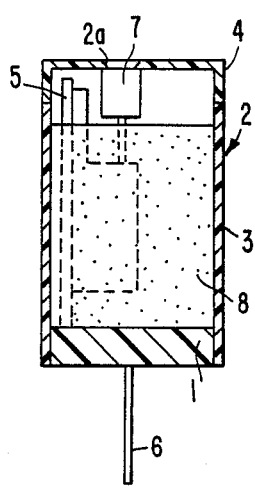
FIG. 2 is a side sectional view of the device of FIG. 1.
Figure 3:
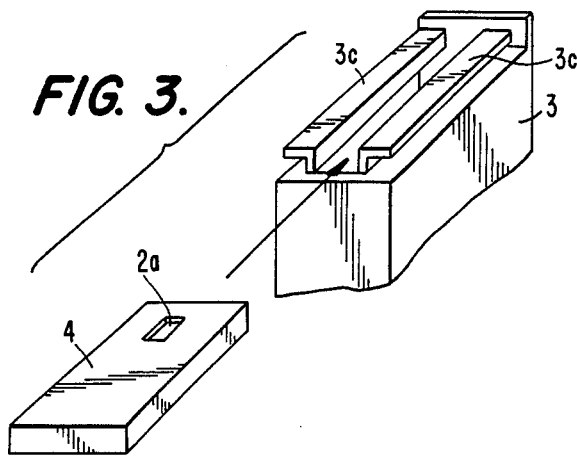
FIG. 3 is a disassembled perspective view of a case employed in an electric device with an operation indicating lamp in a second embodiment of the invention.
Figure 4:
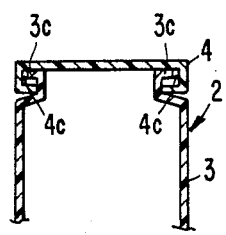
FIG. 4 is a partial side sectional assembled view of the case of FIG. 3.
Figure 5:
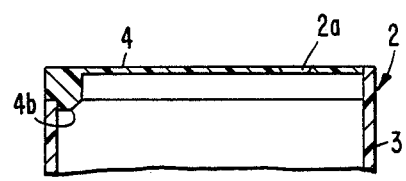
FIG. 5 is a front sectional view of the device of FIG. 4.

Referring to FIGS. 1, 2, 15 and 16, there is shown an electric device which may be employed in a resin molding type solid state relay. The device includes a case 2 which is divisible into a main frame 3 and a case cover 4. The case 2 is fitted to a base 1 at an open end of the main frame 3. A circuit board 5 is electrically connected to a plurality of terminals 6 which protrude from the base 1. An LED 7 serving as an operation indicating lamp is electrically connected to the circuit board 5 and visible through an indicating hole 2a of the case cover 4. A resin material 8 is injected into the space provided by the base 1 and the main frame 3 and set to fix the circuit board 5 and the components 10 mounted on the board 5.

The assembling method of the device will be described hereinafter. First of all, the LED 7 is positioned on the board 5 so that the top thereof slightly protrudes from an edge of the board 5 and is electrically connected at 7a to the board 5. Then, the board 5 is vertically set and electrically connected to the terminals 6. Subsequently, the main frame 3 is fitted to the base 1 at one open end of the frame 3. The resin material 8 is injected into a portion of the space provided by the base 1 and the main frame 3. Finally, the case cover 4 is fitted to the other open end of the main frame 3 so that the LED 7 at least a portion of which is not covered with resin, can be seen through the indicating hole of the case cover 4.

Because the indicating hole 2a is provided in the case cover 4, the resin material 8 does not leak from the indicating hole 2a and the gap between the LED 7 and the indicating hole 2a. The LED 7 does not need to be continuously pushed against the case cover 4, preventing cracks from developing in the solder connecting the LED 7 to the circuit board 5 and allowing the easy assembly of the device. Further, because no packings are required for preventing the resin leakage, the LED 7 can be positioned precisely.

Figure 6:
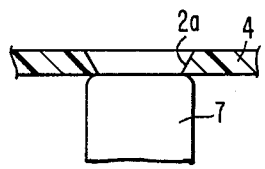
FIG. 6 is an enlarged partial-sectional view of FIG. 4.

In FIGS. 3 through 6 showing an electric device in accordance with a second embodiment of this invention, guide grooves 4c, 4c on case cover 4 are respectively engaged with guide rails 3c, 3c which are longitudinally provided along the longer edge of the open end of the main frame 3. The case cover 4 is slid along the guide rails 3c, 3c to plug the open end of the main frame 3. The case cover 4 has a protrusion 4b with which the cover 4 is locked to the open end of the main frame 3 (See FIG. 5). Further, as shown in FIG. 6, the indicating hole 2a is tapered with the inner diameter smaller than the outer one. Because the minimum diameter of the hole 2a is smaller than the diameter of the LED 7, a gap is not developed between the hole 2a and the LED 7 even if the LED is positioned with a deviation from the normal position, preventing foreign matter such as dust from entering.

In the third embodiment, as shown in FIGS. 7 through 9, the guides 4d, 4d of the case cover 4 are respectively engaged with the guide grooves 3d, 3d provided at the open end of the main frame 3. The case cover 4 is slid along the guide grooves 3d, 3d to plug the opening end of the main frame 3.

In the fourth embodiment, as shown in FIGS. 10 through 12, the case cover 4 has four locking holes 4e, and the main frame 3 has four locking pieces 3e at the open end. The cover 4 is mounted to plug the open end of the maine frame 3 by locking the pieces 3e to the holes 4e. As shown in FIG. 12, the indicating hole 2a provided on the cover 4 is tapered with the outer diameter 2c larger than the inner diameter 2b. Because the minimum diameter is smaller than the diameter of the LED 7, the LED 7 is positioned by the inner wall of the hole 2a leaving no gap between the LED 7 and the hole 2a. Also, case cover 4 may be provided with locking holes 4e for engaging locking pieces 3e, provided on main frame 3. In this embodiment, because the case cover 4 is mounted on the main frame 3 before the resin is set, a bar 4g disposed on the cover 4 is fixed by the resin, preventing the cover 4 from coming off the main frame 3.

Figure 13:
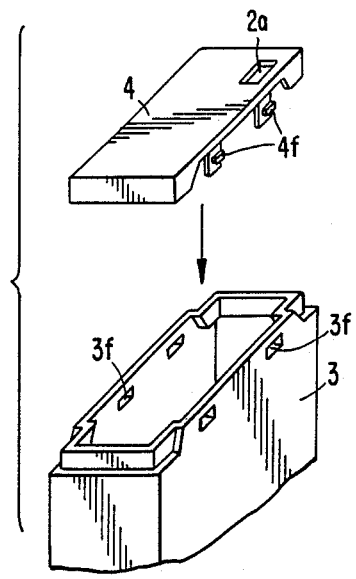
FIG. 13 is a disassembled perspective view of a case employed in an electric device with an operation indicating lamp in a fifth embodiment of this invention.
Figure 15:
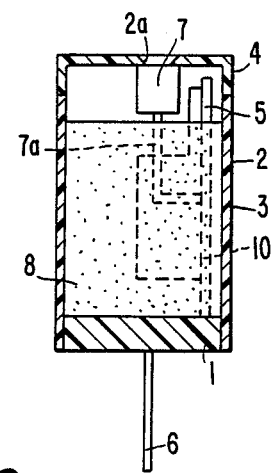
FIG. 15 is a sectional side view taken along the line XV—XV of FIG. 1.
Figure 16:
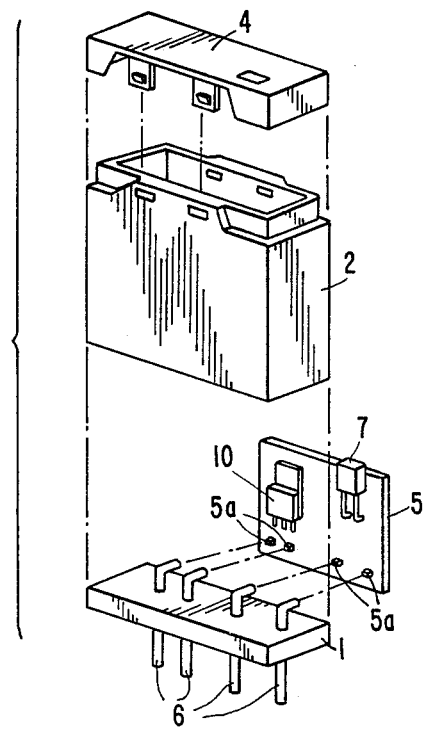
FIG. 16 is perspective view of a disassembled electric device of the type shown in FIGS. 13 and 14.

In the fifth embodiment, as shown in FIGS. 13 and 14, the cover 4 has four locking pieces 4f, and the main frame 3 has four locking holes 3f at the opening. The cover 4 is mounted to plug the open end of the main frame 3 by locking the pieces 4f to the holes 3f.

It should be understood that the above description is merely illustrative of this invention and that many changes and modifications may be made by those skilled in the art without departing from the scope of the appended claims.

What is claimed is:

1. An electric device with an operation indicating lamp comprising:
    a base member;
    a case member including a main frame and a case cover, said main frame being fitted to said base member, and said case cover having an indicating hole therein;
    at least one electric component disposed in said case member;
    an operation indicating lamp housed within said case member abutting said indicating hole and visible therethrough, said indicating lamp having a diameter which is larger than a diameter of said indicating hole; and
    a resin material for fixing said lamp and said electronic component in said case member, said resin material being disposed in a portion of the space provided by said base and said main frame, there being no resin in the vicinity of said indicating hole; and
    said main frame having a pair of guide grooves provided at an open end thereof;
    said case cover having a pair of guides engaging said guide grooves.

2. An electric device with an operation indicating lamp according to claim 1 wherein said indicating lamp is an LED positioned on a circuit board adjacent said case cover.

3. A method of making a resin-filled electric device with an indicating light therein, comprising:
    (a) positioning an indicating lamp on a circuit board at a connecting portion of the circuit board such that said indicating lamp is electrically connected to said circuit board,
    (b) providing a lower base, a main frame and a separable top cover, said cover having an indicating hole formed therein, the diameter of the indicating hole being smaller than a corresponding diameter of the indicating lamp, and said base having electrical terminals formed thereon,
    (c) connecting the board to the electrical terminals on the base,
    (d) assembling said vase to said main frame such that said circuit board and said lamp are disposed within said main frame.
    (e) injecting resin into a portion of the space formed by the assembled main frame and base while the assembled main frame and base are upright, so that a portion of said indicating lamp adjacent said connecting portion is not covered with resin, and
    (f) fitting the cover onto the resin filled main frame with the indicating light adjacent an inner edge of the hole in the cover such that said indicating lamp does not extend through said hole.

4. The method of claim 3 providing sliding the cover onto grooves on the main frame.

5. The method of claim 3, providing interconnecting cooperating locking pieces and locking holes on the main frame and cover, respectively.

6. An electric device with an operation indicating lamp comprising:
    a base member;
    a case member including a main frame and a case cover, said main frame being fitted to said base member, and said case cover having an indicating hole therein;
    at least one electric component disposed in said case member;
    an operation indicating lamp housed within said case member abutting said indication hole and visible therethrough, said indicating lamp having a diameter which is larger than a diameter of said indicating hole; and
    a resin material for fixing said lamp and said electronic component in said case member, said resin material being disposed in a portion of the space provided by said base and said main frame, there being no resin in the vicinity of said indicating hole;
    said case cover having a plurality of locking holes;
    said main frame having a plurality of corresponding locking pieces at an opening thereof which lock to said locking holes.

7. An electric device with an operation indicating lamp comprising:
    a base member;
    a case member including a main frame and a case cover, said main frame being fitted to said base member, and said case cover having an indicating hole therein;

at least one electric component disposed in said case member;

an operation indicating lamp housed within said case member abutting said indicating hole and visible therethrough, said indicating lamp having a diameter which is larger than a diameter of said indicating hole; and a resin material for fixing said lamp and said electronic component in said case member, said resin material being disposed in a portion of the space provided by said base and said main frame, there being no resin in the vicinity of said indicating hole;

said indicating hole having a tapered opening which tapers toward said indicating lamp.

8. An electric device with an operation indicating lamp comprising:

a base member;

a case member including a main frame and a case cover, said main frame being fitted to said base member, and said case cover having an indicating hole therein;

at least one electric component disposed in said case member;

an operation indicting lamp housed within said case member abutting an inner surface of said indicating hole and visible therethrough; and a resin material for fixing said lamp and said electronic component in said case member, said resin material being disposed in a portion of the space provided by said base and said main frame, there being no resin in the vicinity of said indicating hole;

said indicating hole having a tapered opening which tapers away from said indicating lamp;

said indicating lamp having a diameter which is larger than an upper diameter of said tapered indicating hole.

* * * * *